United States Patent [19]

Tamiya et al.

[11] Patent Number: 5,246,564

[45] Date of Patent: Sep. 21, 1993

[54] METHOD OF MANUFACTURING COPPER-POLYIMIDE SUBSTRATE

[75] Inventors: Yukihiro Tamiya; Noriyuki Saeki; Akihiro Miyake; Yoshiyasu Takenaka, all of Niihama, Japan

[73] Assignee: Sumitomo Metal Mining Company, Limited, Tokyo, Japan

[21] Appl. No.: 963,739

[22] Filed: Oct. 20, 1992

[30] Foreign Application Priority Data

Oct. 22, 1991 [JP] Japan .................................. 3-302519
Oct. 31, 1991 [JP] Japan .................................. 3-313842

[51] Int. Cl.$^5$ .............................................. C25D 5/56
[52] U.S. Cl. ................................... 205/169; 427/306
[58] Field of Search ......................... 205/169; 427/306

[56] References Cited

U.S. PATENT DOCUMENTS

| | | | |
|---|---|---|---|
| 4,725,504 | 2/1988 | Knudsen et al. | 428/458 |
| 4,868,071 | 9/1989 | Walsh et al. | 428/626 |
| 4,950,553 | 8/1990 | Walsh et al. | 428/626 |

*Primary Examiner*—T. M. Tufariello
*Attorney, Agent, or Firm*—Watson, Cole, Grindle & Watson

[57] ABSTRACT

A method of manufacturing a copper-polyimide substrate, includes hydrophilicating the surface(s) of a polyimide film, applying a catalyst thereto, subjecting the film to electroless plating, heat-treating it in an inert atmosphere, and subjecting it to electroless copper plating or to electroless copper plating followed by electrolytic copper plating. The hydrophilication of the surface(s) of the polyimide film is effected with an aqueous solution containing a hydrazine hydrate and an alkali metal hydroxide or with an aqueous solution containing a permanganate and/or a hypochlorite, then a catalyst is applied to the surface(s) by an ordinary way, then the surface(s) is/are subjected to electroless plating with any one of nickel, cobalt nickel alloys or cobalt alloys to form a plated layer thereon having a thickness of from 0.01 to 0.1 μm and having an impurity content of 10% by weight or less, and thereafter the resulting substrate is heat-treated in an inert atmosphere under the condition that the highest temperature that the substrate reaches falls within the range of from 350° to 540° C. and that the thermal load coefficient (D) to be obtained by the following numerical expression (1) falls within the range of from 0.3 to 3.5.

$$D = \int_{t=t_0}^{t=t_i} (0.2/\{1.5\exp(447.7 - T_i)/19.196\}) dt \quad (1)$$

where $t_i$ indicates a desired time; and $T_i$ indicates the temperature of the substrate itself at that time.

10 Claims, No Drawings

METHOD OF MANUFACTURING COPPER-POLYIMIDE SUBSTRATE

FIELD OF THE INVENTION

The present invention relates to a method of manufacturing a copper-polyimide substrate which is used in manufacturing printed wiring boards (PWB) such as flexible printed circuits (FPC), tape automated bonding (TAB) tapes, etc.

BACKGROUND OF THE INVENTION

Recently, printed circuits have been required to have an elevated wiring density and an elevated functioning due to development of increasingly small-sized and enhanced performance electronic instruments. Accordingly, the material of the substrate thereof needs to have the smallest possible dielectric constant, the highest possible insulating resistance value, and a good heat resistance. A substrate which satisfies these requirements in polyimide. A polyimide resin is frequently used as a material for FPC and TAB tapes. In general, a copper polyimide substrate having a copper metal layer on one or both surfaces of a filmy polyimide resin is commonly used.

For forming a copper layer on a polyimide resin film, a so-called lamination method has heretofore been employed in which a polyimide resin film is laminated to a copper leaf via an adhesive. In the method, however, since the adhesive has on adverse influence on the insulating property and heat resistance of the substrate, a different method has become employed in which a copper layer is directly formed on a polyimide film by sputtering, ion-plating, vacuum deposition plating or electroless plating.

However, where a copper-polyimide substrate obtained by directly forming a copper layer on the surface of a polyimide film is left in a high temperature atmosphere for a long period of time, there occurs a dangerous problem that the adhesion strength at the interface between the copper layer and the polyimide resin film decreases, such that the layer peels off from the film. After various investigations concerning this problem, it has been found that the lowering of the adhesion strength is caused by diffusion of copper to the polyimide film at the interface between the copper layer and the polyimide film. As a method of preventing the diffusion of copper, an interlayer metal barrier layer an interlayer polyimide film prior to forming the copper layer on the film.

Heretofore, formation of a metal interlayer of nickel, cobalt or the like between a polyimide resin film and a copper layer prior to formation of the copper layer on the polyimide film has been proposed for the purpose of preventing a decrease in the adhesiveness of copper to the film due to thermal shock applied to the film substrate by soldering, for example, as shown in JP-A 63-286580 (the term "JP-A" as used herein means an "unexamined published Japanese patent application"), and U.S. Pat. No.4,725,504, 4,868,071 and 4,950,553. It is said that the thickness of the metal interlayer formed for the purpose must be 0.15 um or more.

Where a copper-polyimide substrate is used in manufacturing FPC and TAB tapes, formation of plural branched fine copper wires on the substrate by a subtractive process, a semi-additive process or a full-additive process is necessary. For instance where formation of such copper wires on the substrate is effected by a subtractive process, a photo-resist is coated on a copper-polyimide substrate having a electroless plated copper layer as formed on a polyimide film or on a substrate additionally having an electroplated copper layer as formed on the copper layer, a photo-mask having a determined lead pattern is closely attached thereto, the substrate is then exposed, developed and etched, whereby the exposed metal layer area is dissolved and removed, and the remaining photo-resist is thereafter peeled and removed to finally form the intended copper wires.

Therefore, in formation of the wires by the process, if a copper-polyimide substrate having a nickel or the like metal interlayer as formed between the polyimide resin film of the substrate and the copper layer in a thickness of 0.15 $\mu$m or more, for example, by the process described in the above-mentioned JP-A 63-286580 and U.S. patents is used, the etching speed differs between the copper and the metal of a different kind of the interlayer, such as nickel or cobalt. In general, since the dissolution speed of the metal of a different kind is lower than that of copper, the interlayer of the metal of a different kind remains on the surface of the polyimide film in formation of copper wires by etching to cause a decrease in the insulating resistance between the wires. If the metal of the interlayer is desired to be completely dissolved and removed, the copper layer would be over-etched so that the side walls of the wire,,s would be dissolved too much, causing deformation of the formed wires. As a result, copper wires of the desired shape will not be obtained.

In the case of employing a semi-additive process in formation of copper wires, the means of forming copper wires by etching is not basically different from the above-mentioned subtractive process, though the procedure of forming copper wires somewhat differs between them. Therefore, also in this case, any satisfactory result could not be obtained because of the same reasons as above.

Accordingly, where FPC and TAB tapes are manufactured by the use of a copper-polyimide substrate having an interlayer of a metal of a different kind, such as nickel or cobalt, addition of a step of selectively etching only the metal of a different kind, such as nickel or cobalt, to the process of manufacturing them is necessary for the purpose of eliminating the above-mentioned problem. However, addition of such a step is troublesome and makes the process complicated, which is economically unfavorable. Since the copper-polyimide substrate having an interlayer of nickel, cobalt or the like metal, as manufactured by the process as disclosed by the above-mentioned JP-A 63-286580 and U.S. patents, is hydrophilicated on the surface of the polyimide film, the surface of the polyimide film absorbs the ambient moisture and swells when the substrate is stored in a high-temperature and high-humidity atmosphere for a long period of time, such that the adhesion strength of the film to the copper layer is thereby lowered, and results in the copper layer being peeled off from the film.

SUMMARY OF THE INVENTION

The object of the present invention is to solve the above-mentioned problem with a copper - polyimide substrate having a metal interlayer made of a metal of a different kind, such as nickel or cobalt, as formed on a polyimide resin film as a subbing layer and to provide a method of manufacturing a copper-polyimide substrate which may well be exposed to a high-temperature atmosphere or high-temperature and high-humidity atmosphere for a long period of time with little decrease in the adhesion strength between the copper layer and the polyimide film and which may well be used in manufacturing FPC or TAB tapes without necessitating any particular etching step for removing the subbing metal layer to form wires on the substrate.

In order to attain the object, there is provided in accordance with the present invention a method of manufacturing a copper - polyimide substrate which comprises hydrophilicating the surface(s) of a polyimide resin film, applying a catalyst thereto, subjecting the film to electroless plating, heat-treating it in an inert atmosphere, and subjecting it to electroless copper plating or to electroless copper plating followed by electrolytic copper plating. Specifically, the method is characterized in that the hydrophilication of the surface(s) of a polyimide resin film is effected with an aqueous solution containing a hydrazine hydrate and an alkali metal hydroxide or with an aqueous solution containing a permanganate and/or a hypochlorite, then a catalyst is applied to the surface(s) by an ordinary way, then the surface(s) is/are subjected to electroless, plating with any of nickel, cobalt, nickel alloys or cobalt alloys to form a plated layer thereon having a thickness of from 0.01 to 0.1 μm and having an impurity content of 10% by weight or less, and thereafter the resulting substrate is heat-treated in an inert atmosphere under the condition that the highest temperature the substrate reaches falls within the range of from 350° to 540° C. and that the thermal load coefficient(D)to be obtained by the following numerical expression (1) falls within the range of from 0.3 to 3.5

$$D = \int_{t=to}^{t=ti} (0.2/\{1.5\exp(447.1 - Ti)/19.196\})dti \quad (1)$$

where ti indicates a desired time; and Ti indicates the temperature of the substrate itself at the time.

In the present invention, the alkali metal to be used in the hydrophilication treatment to be effected with a mixed aqueous solution containing a hydrazine hydrate and an alkali metal hydroxide is, for example, sodium, potassium or lithium. Where an aqueous permanganate solution is used for the hydrophilication treatment, preferred is an aqueous sodium permanganate solution or an aqueous potassium permanganate solution. Where an aqueous hypochlorite solution is used for the treatment, preferred is an aqueous sodium hypochlorite solution or an aqueous potassium hypochlorite solution. As impurities to be in the electrolessly plated layer of nickel, cobalt, nickel alloys or cobalt alloys, there are mentioned not only phosphorus and boron, which are generally in an electrolessly plated layer of the kind, but also any other metal elements.

DETAILED DESCRIPTION OF THE INVENTION

In the present invention, an interlayer of nickel or its alloy, or cobalt or its alloy is provided in the interface between copper and a polyimide film. This is because the interlayer acts as a barrier layer for preventing diffusion of copper into the inside of the polyimide resin during heating of the substrate at a high temperature.

In the present invention, the surface of the polyimide film is hydrophilicated with a mixed aqueous solution comprising a hydrazine hydrate and an alkali metal hydroxide or with an aqueous solution of a permanganate and/or a hypochlorite, prior to provision of the metal interlayer. The reason of using a mixed aqueous solution comprising a hydrazine hydrate and an alkali metal hydroxide for the hydrophilication treatment is because the surface of the polyimide film may easily be hydrophilicated due to cutting of the imide bond in the resin by the hydrazine hydrate and to hydrolysis of the resin with the alkali metal hydroxide so that absorption of the catalyst to be applied to the surface of the resin film as pre-treatment prior to the electroless plating may be thereby facilitated.

If the concentration of the hydrazine hydrate in the mixed solution is less than 1 mol/liter, the effect of cutting the imide bond will not be sufficient; but if it is more than 15 mol/liter, the adhesion strength between the electrolessly plated layer and the polyimide film will decrease. Therefore, the concentration is desired to fall within the range of from 1 to 15 mol/liter. If the concentration of the alkali metal hydroxide in the same is less than 0.5 mol/liter, the hydrolysis will be insufficient; but if it is more than 5 mol/liter, the adhesion strength between them will decrease. Therefore, the concentration is desired to fall within the range of from 0.5 to 5 mol/liter.

Alternatively, a permanganate or hypochlorite aqueous solution may also be used for the hydrophilication treatment in the present invention. This is because an uniformly etched layer is formed on the surface of the polyimide film due to the intensive oxidization by the permanganate or hypochlorite ion so that the surface of the film is completely hydrophilicated. As a result, like the case of using the above-mentioned mixed hydrophilicating solution comprising a hydrazine hydrate and an alkali metal hydroxide, absorption of the catalyst as applied to the thus hydrophilicated surface of the film may well be facilitated.

If the concentration of the permanganate in the hydrophilicating solution is less than 1 mol/liter, or if the residual chlorine concentration in the aqueous hypochlorite solution is less than 3% by weight, the hydrophilicating of the solution will noticeably decrease so that the etching rate with the solution will thereby noticeably decrease. As a result, formation of an uniformly etched layer will be impossible. On the contrary, if the residual chlorine concentration in the aqueous hypochlorite solution is more than 13% by weight, the hydrophilicating solution will be unstable to often cause undesirable autolysis.

As the permanganate, use of sodium permanganate or potassium permanganate is desired in view of the solubility and easy availability thereof. As the hypochlorite, use of sodium hypochlorite or potassium hypochlorite is economically advantageous as it is frequently used in industrial scale.

Hydrophilication of the surface of a polyimide resin film with such a hydrophilicating solution may be effected by any ordinary method, and the necessary time for the treatment may well be generally from 30 seconds to 5 minutes in every case, though not defined indiscriminately.

For application of a catalyst to the thus hydrophilicated surface of the polyimide film, any known method of using a catalyst-activating metal of a noble metal, such as gold, silver, platinum or palladium, which has heretofore been used for pre-treatment prior to electroless plating, may be employed. The details are not referred to herein.

In the present invention, electroless plating is applied to the interface between copper and a polyimide resin film to form a metal interlayer therebetween. The metal interlayer is made of nickel, cobalt, nickel alloys or cobalt alloys. This is because the interlayer of the metal or metal alloy has an action of inhibiting diffusion of copper into the inside of the polyimide during heating of the substrate at a high temperature. Formation of the interlayer of nickel, cobalt, nickel alloys or cobalt alloys may be effected by any ordinary electroless plating. In the case, the thickness of the interlayer of the electrolessly plated film is defined to fall within the range of from 0.01 to 0.1 μm in the present invention. This is because if the thickness is less than 0.01 μm, the effect of the layer of preventing diffusion copper into the polyimide would be insufficient so that, when the substrate is left in an oxygen-containing atmosphere such as air at a temperature of 150° C. or higher for a long period of time, then the adhesion strength, between the metal layer and the polyimide will decrease due to diffusion of copper to the polyimide film. On the contrary, if the thickness is more than 0.1 μm, nickel, cobalt, nickel alloys or cobalt alloys of the interlayer would remain on the polyimide film in the step of etching the copper layer for forming copper wires on the substrate by a subtractive process or semi-additive process and, as a result the insulating resistance between the formed wires will decrease.

In the present invention, the impurity content in the interlayer of nickel, cobalt or alloys thereof is defined to be 10% by weight or less. This is because depression of the solubility of nickel, cobalt, nickel alloys or cobalt alloys in the etching step for forming copper wires is prevented. If the impurity content is more than 10% by weight, there would occur a problem that the insulating resistance between wires decreases.

As mentioned above, after an interlayer of nickel, cobalt, nickel alloys or cobalt alloys has been formed on a polyimide film in accordance with the present invention, the film is then heat-treated. This is for the purpose of hydrophobicating the surface of the hydrophilicated polyimide film so that, when the obtained copper polyimide substrate is exposed to a high-temperature atmosphere or high temperature and high-humidity atmosphere for a long period of time, decrease of the adhesion strength between the metal layer and the film is thereby prevented.

The heat-treatment is effected in an inert atmosphere under the condition that the highest temperature that the substrate reaches falls within the range of from 350° C. to 540° C. and that the thermal load coefficient (D) to be obtained by the following numerical expression (1) is to fall within the range of from 0.3 to 3.5

$$D = \int_{t=t_0}^{t=t_i} (0.2/\{1.5\exp(447.7 - T_i)/19.196\}) dt \quad (1)$$

where ti indicates a desired time; and Ti indicates the temperature of the substrate itself at that time.

The reasons why the highest temperature reached in the heat-treatment is defined to fall within the above-mentioned range is because if the temperature is lower than 350° C., the empirical law for defining the thermal load coefficient could not be established; but if it is higher than 540° C., it will be difficult to control the thermal load coefficient D to be in the range of 0.3 to 3.5 and the polyimide film will be inevitably deteriorated.

The thermal load coefficient(D) of the present invention is a function of the temperature and the time and is obtained by the above-mentioned numerical expression (1). The numerical expression is a so-called empirical formula so that it may apply to any different heat-treatment apparatus. If the heat treatment of the substrate of the present invention is effected under the condition that the thermal load coefficient is less than 0.3, the adhesion strength between the metal layer and the polyimide film under a high-temperature atmosphere or high-temperature and high-humidity atmosphere would decrease; but if it effected under the condition that the coefficient is more than 3.5, the mechanical strength of the polyimide film of itself would noticeably decrease. Anyhow, both cases of overstepping the defined range are disadvantageous.

After formation of the metal interlayer, the substrate is subjected to electroless copper plating or to electroless copper plating followed by electrolytic copper plating, which may well be effected by any known technology. The heat-treatment apparatus to be used for heat treatment to be effected after formation of the metal interlayer in the present invention may be any heating apparatus a hot air circulating heating furnace or an infrared radiation furnace, and the heat treatment is effected in an inert gas atmosphere of nitrogen or the like. In the above, the present invention has been explained in detail with reference to an embodiment of using copper as a metal of forming wires on the substrate. However, the illustrated embodiment is not limitative. The present invention may well apply to any other cases of using other metals than copper for forming wires on the substrate, in which the heat treatment conditions may suitably be determined within the above-mentioned range of the present invention.

Next, the present invention will be explained in more detail by way of the following examples, which are grouped into the case of using a mixed aqueous solution comprising a hydrazine hydrate and an alkali metal hydroxide for hydrophilication of a polyimide film and the case of using an aqueous solution of a permanganate or a hypochlorite for the same. The present invention is not limited to these examples.

Examples of using a mixed aqueous solution comprising a hydrazine hydrate and an alkali metal hydroxide as a hydrophilicating solution

EXAMPLE 1

A 30 cm×30 cm polyimide film of Kapton 200H (produced by Toray-DuPont Co., Ltd.) was dipped in an aqueous solution of 25° C. containing 5 mol/liter of hydrazine hydrate and 3 mol/liter of sodium hydroxide, for 60 seconds so that the surface of the polyimide film was hydrophilicated. Next, one side of the film surfaces was masked, and the other side of film was subjected to catalytic activation treatment by an ordinary method. This was then subjected to electroless nickel plating under the condition shown in Table 1 below.

TABLE 1

| Composition of Plating Bath | |
|---|---|
| $NiCl_2 \cdot 6H_2O$ | 0.1 mol/l |
| $NaH_2PO_2 \cdot H_2O$ | 0.1 mol/l |
| Sodium Citrate | 0.2 mol/l |
| pH | 9 |

TABLE 1-continued

| Plating Condition | |
|---|---|
| Temperature | 60° C. |
| Time | 30 seconds |

The thickness of the electrolessly plated nickel layer thus formed was 0.05 um. The phosphorus content as impurity in the layer was 7% by weight.

Afterwords, using a hot air circulating heating furnace (manufactured by Koyo Lindberg Co., Ltd.), the substrate (nickel-plated polyimide film) was heated up to 400° C. at a temperature-elevating rate of 9° C./min in a nitrogen atmosphere, then the substrate was kept at the temperature for 1.5 hours, and thereafter it was cooled at a temperature-lowering speed of 2.5° C./min. The thermal load coefficient during the heat treatment was 0.7. Next, the substrate was subjected to electroless copper plating under the condition as shown in Table 2 below to form a copper film of 0.4 μm thereon. Further, this was subjected to electrolytic copper plating under the condition as shown in Table 3 below.

TABLE 2

| Composition of Plating Bath | |
|---|---|
| $CuSO_4.5H_2O$ | 10 g/l |
| $EDTA.2Na$ | 30 g/l |
| 37% HCHO | 5 g/l |
| a,a'-Dipyridyl | 20 mg/l |
| PEG #1000 | 0.5 g/l |
| Plating Condition | |
| Temperature | 65° C. |
| Stirring | aerial stirring |
| Time | 10 min |

TABLE 3

| Composition of Plating Bath | |
|---|---|
| $CuSO_4.5H_2O$ | 120 g/l |
| $H_2SO_4$ | 150 g/l |
| Electrolyzing Condition | |
| Temperature | 25° C. |
| Cathode Current Density | 2 A/dm$^2$ |
| Stirring | aerial stirring |
| Time | 90 min |

The thickness of the copper layer formed was 35 μm. Over the copper film of the thus obtained copper polyimide substrate having the nickel interlayer, was uniformly coated an acrylic resin photo-resist in a thickness of 10 μm. This was then heated at 70° C. for 30 minutes. Next, a masking was applied to the surface of the substrate to have a wire width of 200 μm, and the photoresist layer was exposed to ultraviolet rays of 300 mj/cm and then developed. The exposed copper surface was etched under the condition as shown in Table 4 below to dissolve the copper.

TABLE 4

| Composition of Etching Liquid | |
|---|---|
| 30% $H_2O_2$ ($H_2O_2$) | 100 g/l |
| $H_2SO_4$ | 150 g/l |
| Treating Condition | |
| Temperature | 25° C. |
| Time | 4 min |
| Stirring | shaking stirring |

Next, the resist layer was removed with an aqueous 4 wt.% sodium hydroxide solution at 60° C., and the presence or absence of the remaining nickel layer between the formed wires was checked and the insulating resistance value was measured. As a result, no nickel layer remained between the formed wires, and the insulating resistance was $1 \times 10^{10}$ Ω (IPC-TM-650 2.6.3.2. C-24/23/50). Thus, the results were good. The adhesion strength between the copper and the polyimide film was measured to be a high value of 1400 g/cm. The substrate was left in an aerial atmosphere at 150° C. for 1000 hours, and the adhesion strength between them was again measured to be 1200 g/cm. The value was not almost lowered from the initial value of the fresh sample. The substrate was left in a high-temperature and high-humidity atmosphere at 85° C. and 85% RH for 1000 hours, and the same measurement was made to give an extremely high value of 1000 g/cm.

The results indicate that, when the copper-polyimide substrate as obtained by the method of the present invention, which had a nickel interlayer with a thickness of 0.05 m and an impurity content of 7% by weight, was heat-treated at a temperature of 400° C. under the condition of a thermal load coefficient of 0.7, then the nickel layer did not remain at all even though it was etched by a conventional etching method without applying any particular etching means thereto for dissolution of the interlayer. They also indicate that the wiring board to be obtained from the copper-polyimide resin substrate as formed by the present invention still had a high adhesion strength even after it had been left in a high-temperature atmosphere or in a high-temperature and high-humidity atmosphere for a long period of time. Thus, the copper-polyimide substrate was verified to have high reliability as a printed wiring board.

EXAMPLE 2

A 30 cm × 30 cm polyimide film of Kapton 200H (produced by Toray-DuPont Co., Ltd.) was dipped in an aqueous solution of 25° C. containing 5 mol/liter of hydrazine hydrate and 3 mol/liter of sodium hydroxide, for 60 seconds so that the surface of the polyimide film was hydrophilicated. Next, one side of the film surfaces was masked, and the film was subjected to catalytic activation treatment by an ordinary method. This was then subjected to electroless cobalt plating under the condition shown in Table 5 below.

TABLE 5

| Composition of Plating Bath | |
|---|---|
| $CoSO_4.7H_2O$ | 0.05 mol/l |
| $NaH_2PO_2.H_2O$ | 0.2 mol/l |
| Sodium Citrate | 0.2 mol/l |
| pH | 10 |
| Plating Condition | |
| Temperature | 60° C. |
| Time | 2 min |

The thickness of the electrolessly plated cobalt layer thus formed was 0.05 um. The phosphorus content as impurity in the layer was 3% by weight.

Afterwards, using a hot air circulating heating furnace (manufactured by Koyo Lindberg Co., Ltd.), the substrate (cobalt-plated polyimide film) was heated up to 420° C. at a temperature-elevating rate of 9° C./min in a nitrogen atmosphere, then the substrate was kept at the temperature for 1.5 hours, and thereafter it was cooled at a temperature-lowering rate of 2.5° C./min. The thermal load coefficient during the heat treatment was 3.1.

Using this, a copper polyimide substrate was prepared and wires were formed thereon in the same manner as in Example 1. Presence or absence of the remaining cobalt layer between the formed wires was checked and the insulating resistance value was measured also in the same manner as in Example 1. As a result, no cobalt layer remained between the formed wires, and the insulating resistance was $1 \times 10^{10}$ Ω (IPC-TM-650 2.6.3.2. C-23/50). Thus, the results were good. The adhesion strength between metal and the polyimide film was measured to be a high value of 1250 g/cm. The substrate was left in an aerial atmosphere at 150° C. for 1000 hours, and the adhesion strength between them was again measured to be 1050 g/cm. The value was not almost lowered from the initial value of the fresh sample. The substrate was left in a high-temperature and high-humidity atmosphere of 85° C. and 85% RH for 1000 hours, and the same measurement was made to give an extremely high value of 950 g/cm.

The results indicate that, when the copper-polyimide substrate as obtained by the method of the present invention, which had a cobalt interlayer with a thickness of 0.05 μm and an impurity content of 3% by weight, was heat-treated at a temperature of 420° C. under the condition of a thermal load coefficient of 3.1, then the cobalt layer did not remain at all even though it was etched by a conventional etching method without applying any particular etching means thereto for dissolution of the cobalt interlayer. They also indicate that the wiring board to be obtained from the copper-polyimide substrate as formed by the present invention still had a high adhesion strength even after it had been left in a high-temperature atmosphere or in a high-temperature and high-humidity atmosphere for a long period of time. Thus, the copper-polyimide substrate was verified to have high reliability as a printed wiring board.

EXAMPLE 3

A copper-polyimide substrate was formed and wires were formed thereon in the same manner as in Example 2, except that electroless nickel plating was applied to the both surfaces of the polyimide film. In the thus obtained wiring board, presence or absence of the remaining nickel layer between the formed wires was checked and the insulating resistance value was measured in the same manner as in Example 1. As a result, no nickel layer remained between the formed wires on the both surfaces, and the insulating resistance on the respective surfaces was $1 \times 10^{10}$ Ω and $2 \times 10^{10}$ Ω (IPC-TM-650 2.6.3.2. C-24/23/50). Thus, the results were good.

The adhesion strength between the metal and the polyimide film on the respective surfaces was measured to be 1300 g/cm and 950 g/cm. Thus, the both surfaces each had a fairly high value. The substrate was left in an aerial atmosphere of 150° C. for 1000 hours, and the adhesion strength between them on the respective surfaces was again measured to be 1050 g/cm and 800 g/cm. The both values were not almost lowered from the initial ones of the fresh sample. The substrate was left in a high-temperature and high-humidity atmosphere of 85° C. and 85% RH for 1000 hours, and the same measurement was made to give 1000 g/cm and 800 g/cm. These values have no problem for practical use of the substrate.

The results indicate that, when the copper-polyimide substrate as obtained by the method of the present invention, which had a nickel interlayer with a thickness of 0.05 μm and an impurity content of 3 % by weight, was heat-treated at a temperature of 420° C. under the condition of a thermal load coefficient of 3.1, then the nickel layer did not remain at all even though it was etched by a conventional etching method without applying any particular etching means thereto for dissolution of the nickel interlayer. They also indicate that the wiring board to be obtained from the copper polyimide substrate as formed by the present invention still had a high adhesion strength even after it had been left in a high-temperature atmosphere or in a high-temperature and high-humidity atmosphere for a long period of time. Thus, the copper-polyimide substrate was verified to have high reliability as printed wiring boards or FPC and TAB tapes.

EXAMPLE 4

A copper polyimide substrate was formed and wires were formed thereon in the same manner as in Example 1, except that the substrate was, after the electroless nickel plating, heated up to 480° C. at a temperature-elevating rate of 40° C./min in a nitrogen atmosphere under the condition of a thermal load coefficient of being 0.7, using a far infrared radiation furnace, then the substrate was left under the heat-treating condition for 30 seconds and thereafter cooled at a temperature-lowering rate of 160° C./min. In the thus obtained wiring board, presence or absence of the remaining nickel layer between the formed wires was checked and the insulating resistance value was measured in the same manner as in Example 1.

As a result, no nickel layer remained between the formed wires, and the insulating resistance was $1 \times 10^{10}$ Ω (IPC-TM-650 2.6.3.2. C-24/23/50). Thus, the results were good. The adhesion strength between the copper and the polyimide film was measured to be an extremely high value of 1400 g/cm.

The substrate was left in an aerial atmosphere of 150° C. for 1000 hours, and the adhesion strength between the metal and the polyimide film was again measured to be 1250 g/cm. The value was not almost lowered from the initial one of the fresh sample. The substrate was left in a high-temperature and high-humidity atmosphere of 85° C. and 85% RH for 1000 hours, and the same measurement was made to give 1100 g/cm. These values were extremely good.

The results indicate that, when the copper-polyimide substrate as obtained by the method of the present invention, which had a nickel interlayer with a thickness of 0.05 μm and an impurity content of 7% by weight, was heat-treated at a temperature of 480° C. under the condition of a thermal load coefficient of 0.7, then the nickel layer did not remain at all even though it was etched by a conventional etching method without applying any particular etching means thereto for dissolution of the nickel interlayer. They also indicate that the wiring board to be obtained from the copper-polyimide substrate as formed by the present invention still had a high adhesion strength even after it had been left in a high-temperature atmosphere or in a high-temperature and high-humidity atmosphere for a long period of time. Thus, the copper-polyimide substrate was verified to have high reliability as a printed wiring boards.

COMPARATIVE EXAMPLE 1

A 30 cm × 30 cm polyimide film of Kapton 200H (produced by Toray-DuPont Co., Ltd.) was dipped in an aqueous solution of 25° C. containing 0.5 mol/liter of hydrazine hydrate and 0.3 mol/liter of sodium hydroxide, for 2 minutes so that the surface of the polyimide film was hydrophilication. Next, one side of the film surfaces was masked, and the other side of film was subjected to catalytic activation treatment by an ordinary method. This was subjected to electroless nickel plating under the same condition as that in Example 1. As a result, deposition of nickel on the surface of the film was uneven so that the film could not be processed further.

From the result, it is understood that, when the concentration of the hydrazine hydrate and that of the alkali metal hydroxide in the hydrophilicating solution each are lower than the range defined by the present invention, then formation of the electrolessly plated layer on the resin film is insufficient.

COMPARATIVE EXAMPLE 2

A 30 cm×30 cm polyimide film of Kapton 200H (produced by Toray-DuPont Co., Ltd.) was dipped in an aqueous solution at 25° C. containing 5 mol liter of hydrazine hydrate and 3 mol/liter of sodium hydroxide, for 60 seconds so that the surface of the polyimide film was hydrophilicated. Next, one side of the film surfaces was masked, and the film was subjected to catalytic activation treatment by an ordinary method. This was subjected to electroless nickel plating under the condition as shown in Table 6 below.

TABLE 6

| Composition of Plating Bath | |
| --- | --- |
| $NiCl_2.6H_2O$ | 0.1 mol/l |
| $NaH_2PO_2.H_2O$ | 0.1 mol/l |
| Sodium Citrate | 0.1 mol/l |
| pH | 5.6 |
| Plating Condition | |
| Temperature | 60° C. |
| Time | 1 min |

The thickness of the electrolessly plated nickel layer formed was 0.03 μm. The phosphorus content as impurity in the layer was 12 % by weight. Using this, a copper polyimide substrate was prepared and wires were formed thereon in the same manner as in Example 1. In the wiring board obtained, presence or absence of the remaining nickel layer between the wires formed was checked and the insulating resistance value was measured. As a result, presence of the remaining nickel layer was admitted between the wires, and the insulating resistance was noticeably lowered to be $4 \times 10^6$ Ω (IPC-TM-650 2.6.3.2 C-23/50).

From the results, it is understood that, when the impurity content in the electrolessly plated nickel layer as formed on one side of a polyimide film surfaces is more than 10% by weight, the nickel layer remained in the step of etching the copper polyimide substrate to lower the insulating resistance value of the substrate, even though the thickness of the plated nickel layer was less than 0.1 μm. Thus, the reliability of the substrate for use in manufacturing a wiring board is much low.

COMPARATIVE EXAMPLE 3

A 30 cm×30 cm polyimide film of Kapton 200H (produced by Toray-DuPont Co., Ltd.) was dipped in an aqueous solution of 25° C. containing 5 mol/liter of hydrazine hydrate and 3 mol/liter of sodium hydroxide, for 30 seconds so that the surface of the polyimide resin film was hydrophilicated. Next, one side of the film surfaces was masked, and the other side of film was subjected to catalytic activation treatment by an ordinary method. This eas subjected to electroless nickel plating under the condition as shown in Table 7 below.

TABLE 7

| Composition of Plating Bath | |
| --- | --- |
| $NiCl_2.6H_2O$ | 0.1 mol/l |
| $NaH_2PO_2.H_2O$ | 0.1 mol/l |
| Sodium Pyrophosphate | 0.2 mol/l |
| pH | 10 |
| Plating Condition | |
| Temperature | 60° C. |
| Time | 5 min |

The thickness of the electrolessly plated nickel layer formed was 0.15 μm. The phosphorus content as impurity in the layer was 3.4% by weight. Using this, a copper polyimide substrate was prepared and wires were formed thereon in the same manner as in Example 1. In the wiring board obtained, presence or absence of the remaining nickel layer between the wires formed was checked and the insulating resistance value was measured. As a result, presence of the remaining nickel layer was admitted between the wires, and the insulating resistance was noticeably lowered to be $4 \times 10^6$ Ω (IPC-TM-650 2.6.3.2 C-24/23/50).

From the results, it is understood that, when the thickness of the electrolessly plated nickel layer as formed on the polyimide resin film was more than 0.1 μm, then the nickel layer remained in the step of etching the copper polyimide substrate to lower the insulating resistance value of the substrate, even though the impurity content in the nickel layer was lower than 10% by weight to be 3.4% by weight. Thus, the reliability of the substrate for use in manufacturing a wiring board is much low.

COMPARATIVE EXAMPLE 4

A 30 cm×30 cm polyimide film of Kapton 200H (produced by Toray-DuPont Co., Ltd.) was dipped in an aqueous solution of 25° C. containing 5 mol/liter of hydrazine hydrate and 3 mol/liter of sodium hydroxide, for 60 seconds so that the surface of the polyimide resin film was hydrophilicated. Next, one side of the film surfaces was masked, and the other side of film was subjected to catalytic activation treatment by an ordinary method. This was subjected to electroless nickel plating under the condition as shown in Table 8 below.

TABLE 8

| Composition of Plating Bath | |
| --- | --- |
| $NiCl_2.6H_2O$ | 0.1 mol/l |
| $NaH_2PO_2.H_2O$ | 0.1 mol/l |
| Sodium Pyrophosphate | 0.2 mol/l |
| pH | 10 |
| Plating Condition | |
| Temperature | 60° C. |
| Time | 10 sec |

The thickness of the electrolessly plated nickel layer formed was 0.005μm. The phosphorus content as impurity in the layer was 3.4% by weight. Using this, a copper-polyimide substrate was prepared and wires were formed thereon in the same manner as in Example 1. In the wiring board obtained, presence or absence of the remaining nickel layer between the wires formed was checked and the insulating resistance value was measured. As a result, presence of the remaining nickel layer was not admitted between the wires, and the insulating resistance was satisfactorily $4 \times 10^{10} \Omega$ (IPC-TM-650 2.6.3.2 C-24/23/50). The adhesion strength between the metal and the polyimide film of the substrate was measured to be satisfactorily 1250 g/cm. However, when the substrate was left in an aerial atmosphere of 150° C. for 1000 hours, the adhesion strength noticeably lowered from 1250 g/cm to 100 g/cm. When it was left in a high-temperature and high-humidity atmosphere of 85° C. and 85% RH for 1000 hours, the adhesion strength also lowered to 150 g/cm.

From the results, it is understood that, when the thickness of the electrolessly plated nickel layer as formed on the polyimide film was less than 0.01 μm, then the adhesion strength between copper and the polyimide film noticeably lowered when the substrate was left in a high-temperature atmosphere or in a high-temperature and high-humidity atmosphere for a long period of time, even though the impurity content in the nickel layer was lower than 10% by weight. Thus, the reliability of the substrate for use in manufacturing a wiring board is much low.

COMPARATIVE EXAMPLE 5

A copper polyimide substrate was formed in the same manner as in Example 1, except that the thermal load coefficient in the heat treatment was 0.2 and that the reaching highest temperature in the same was 380° C. The adhesion strength between copper and the polyimide film in the substrate was measured to be 1000 g/cm. However, when the substrate was left in a high-temperature and high-humidity atmosphere of 85° C. and 85% RH for 1000 hours, the adhesion strength was measured to noticeably lower to 50 g/cm.

The results indicate that, when the thermal load coefficient in the heat treatment was lower than the defined value to be 0.2, then the adhesion strength between the metal and the polyimide film in the substrate noticeably lowered after long-time exposure of the substrate to a high-temperature atmosphere or high-temperature and high-humidity atmosphere. Thus, the reliability of the substrate for use in manufacturing a wiring boards is much low. Examples of using a permanganate or hypochlorite solution as a hydrophilicating solution

EXAMPLE 5

A 30 cm × 30 cm polyimide film of Kapton 200H (produced by Toray-DuPont Co., Ltd.) was dipped in an aqueous solution of 50° C. containing 0.3 mol/l of potassium permanganate, for 5 minutes so that the surface of the polyimide film was hydrophilicated. Then, this was fully washed with water. Next, one side of the film surfaces was masked, and the other side of film was subjected to catalytic activation treatment with OPC-80 Catalyst M (produced by Okuno Chemical Industries Co., Ltd.) at 25° C. for 5 minutes. After washed with water, this was subjected to acceleration treatment with OPC-555 Accelerator (produced by Okuno Chemical Industries Co., Ltd.) at 25° C. for 7 minutes and thereafter again washed with water sufficiently. Next, this was subjected to electroless nickel plating under the condition shown in Table 9 below.

TABLE 9

| Composition of Plating Bath | |
| --- | --- |
| $NiCl_2.6H_2O$ | 0.1 mol/l |
| $NaH_2PO_2.H_2O$ | 0.1 mol/l |
| Sodium Citrate | 0.2 mol/l |

TABLE 9-continued

| pH | 9 |
| --- | --- |
| Plating Condition | |
| Temperature | 60° C. |
| Time | 30 sec |

The thickness of the electrolessly plated nickel layer thus formed was 0.05 μm. The impurity in the layer was substantially phosphorus, and the content thereof was 7% by weight.

Afterwards, using a hot air circulating heating furnace (manufactured by Koyo Lindberg Co., Ltd.), the substrate (nickel-plated polyimide film) was heated up to 400° C. at a temperature-elevating rate of 9° C./min in a nitrogen atmosphere, then the substrate was kept at the temperature for 1.5 hours, and thereafter it was cooled at a temperature-lowering rate of 2.5° C./min. The thermal load coefficient during the heat treatment was 0.7. Next, the substrate was subjected to electroless copper plating under the condition as shown in Table 10.

TABLE 10

| Composition of Plating Bath | |
| --- | --- |
| $CuSO_4.5H_2O$ | 10 g/l |
| EDTA.2Na | 30 g/l |
| 37% HCHO | 5 g/l |
| α,α'-Dipyridyl | 20 mg/l |
| PEG #1000 | 0.5 g/l |
| Plating Condition | |
| Temperature | 65° C. |
| Stirring | aerial stirring |
| Time | 10 min |

By the treatment, an electrolessly plated copper layer of 0.4 μm was formed on the substrate. To the copper film, was applied an electrolytic copper plating under the condition as shown in Table 11 below.

TABLE 11

| Composition of Plating Bath | |
| --- | --- |
| $CuSO_4.5H_2O$ | 120 g/l |
| $H_2SO_4$ | 150 g/l |
| Electrolyzing Condition | |
| Temperature | 25° C. |
| Cathode Current Density | 2 A/dm² |
| Stirring | aerial stirring |
| Time | 90 min |

By the treatment, the thickness of the copper-layer formed was 35 μm.

Over the copper film of the thus obtained copper polyimide substrate having the nickel interlayer, was uniformly coated an acrylic resin photo-resist in a thickness of 10 μm. This was then heated at 70° C. for 30 minutes. Next, a masking was applied to the surface of the substrate to have a wire width of 200 μm, and the photo-resist layer was exposed to ultraviolet rays of 300 mj/cm and then developed. The exposed copper surface was etched under the condition as shown in Table 12 below to dissolve the copper.

TABLE 12

| Composition of Etching Liquid | |
| --- | --- |
| 30% $H_2O_2$ ($H_2O_2$) | 100 g/l |
| $H_2SO_4$ | 150 g/l |
| Treating Condition | |
| Temperature | 25° C. |
| Time | 4 min |

| TABLE 12-continued | |
|---|---|
| Stirring | shaking stirring |

Next, the resist layer was removed with an aqueous 4 wt.% sodium hydroxide solution at 60° C., and the presence or absence of the remaining nickel layer between the formed wires was checked and the insulating resistance value was measured. As a result, no nickel layer remained between the formed wires, and the insulating resistance was $1 \times 10^{10}$ Ω (IPC-TM-650 2.6.3.2. C-24/23/50). Thus, the results were good. The adhesion strength between the metal and the polyimide film was measured to be a high value of 1300 g/cm. The substrate was left in an aerial atmosphere of 150° C. for 1000 hours, and the adhesion strength between them was again measured to be 1100 g/cm. The value was not almost lowered from the initial value of the fresh sample.

The substrate was left in a high-temperature and high-humidity atmosphere of 85° C. and 85% RH for 1000 hours, and the same measurement was made to give an extremely high value of 1000 g/cm.

The results indicate that, when the copper-polyimide substrate as obtained by the method of the present invention of effecting the hydrophilication with an aqueous potassium permanganate, which had a nickel interlayer with a thickness of 0.05 μm and an impurity content of 7% by weight, was heat-treated at a temperature of 400° C. under the condition of a thermal load coefficient of 0.7, then the nickel layer did not remain at all even though it was etched by a conventional etching method without applying any particular etching means thereto for dissolution of the interlayer. They also indicate that the wiring board to be obtained from the copper-polyimide substrate as formed by the present invention still had a high adhesion strength even after it had been left in a high-temperature atmosphere or in a high-temperature and high-humidity atmosphere for a long period of time. Thus, the copper-polyimide substrate was verified to have high reliability as a printed wiring boards.

EXAMPLE 6

A 30 cm×30 cm polyimide resin film of Kapton 200H (produced by Toray-DuPont Co., Ltd.) was dipped in an aqueous solution of 40° C. containing 1 mol/liter of potassium permanganate, for 10 minutes so that the surface of the polyimide resin film was hydrophilicated. Next, one side of the film surfaces was masked, and the other sides of film was subjected to catalytic activation treatment in the same manner as in Example 5. This was then subjected to electroless cobalt plating under the condition shown in Table 13 below.

TABLE 13

| Composition of Plating Bath | |
|---|---|
| CoSO$_4$.7H$_2$O | 0.05 mol/l |
| NaH$_2$PO$_2$.H$_2$O | 0.2 mol/l |
| Sodium Citrate | 0.2 mol/l |
| pH | 10 |
| Plating Condition | |
| Temperature | 60° C. |
| Time | 2 min |

The thickness of the electrolessly plated cobalt layer thus formed was 0.03 μm. The impurity phosphorus content in the layer was 3% by weight.

Afterwards, using a hot air circulating heating furnace (manufactured by Koyo Lindberg Co., Ltd.), the substrate (cobalt-plated polyimide resin film) was heated up to 420° C. at a temperature-elevating rate of 9° C./min in a nitrogen atmosphere, then the substrate was kept at the temperature for 1.5 hours, and thereafter it was cooled at a temperature-lowering rate of 2.5° C./min. The thermal load coefficient during the heat treatment was 3.1.

Using this, a copper-polyimide substrate was prepared and wires were formed thereon in the same manner as in Example 5. In the wiring board thus obtained, presence or absence of the remaining cobalt layer between the formed wires was checked and the insulating resistance value was measured also in the same manner as in Example 5. As a result, no cobalt layer remained between the formed wires, and the insulating resistance was $1 \times 10^{10}$ Ω (IPC-TM-650 2.6.3.2. C-24/23/50). Thus, the results were good. The adhesion strength between the metal and the polyimide film was measured to be a high value of 1200 g/cm.

The substrate was left in an aerial atmosphere of 150° C. for 1000 hours, and the adhesion strength between them was again measured to be 1050 g/cm. The value was not almost lowered from the initial value of the fresh sample. The substrate was left in a high-temperature and high-humidity atmosphere of 85° C. and 85% RH for 1000 hours, and the same measurement was made to give an extremely high value of 900 g/cm. This is quite out of problem for practical use of the substrate. After the metal on the polyimide resin film was completely peeled off, the elongation and the tensile strength of the film were measured to the result of almost same of the fresh polyimide film.

The results indicate that, when the copper-polyimide substrate as obtained by the method of the present invention, which had a cobalt interlayer with a thickness of 0.03 μm and an impurity content of 3% by weight, was heat-treated at a temperature of 420° C. under the condition of a thermal load coefficient of 3.1, then the cobalt layer did not remain at all even though it was etched by a conventional method without applying any particular etching means thereto for dissolution of the cobalt interlayer. They also indicate that the wiring board to be obtained from the copper-polyimide substrate as formed by the present invention still had a high adhesion strength even after it had been left in a high-temperature atmosphere or in a high-temperature and high-humidity atmosphere for a long period of time. Thus, the copper-polyimide substrate was verified to have high reliability as a printed wiring boards.

EXAMPLE 7

A copper-polyimide substrate was formed and wires were formed thereon in the same manner as in Example 6, except that electroless nickel plating under the condition shown in Table 9 was applied to the both surfaces of the polyimide film. In the thus obtained wiring board, presence or absence of the remaining nickel layer between the wires as formed on the both surfaces was checked and the insulating resistance value of the both surfaces was measured in the same manner as in Example 6. As a result, no nickel layer remained between the formed wires on -the both surfaces, and the insulating resistance on the respective surfaces was $1 \times 10^{10}$ Ω

(IPC-TM-650 2.6.3.2 C-24/23/50). Thus, the results were good.

The adhesion strength between the copper and the polyimide film on the respective surfaces was measured to be 1300 g/cm and 950 g/cm. Thus, the both surfaces each had a fairly high value. The substrate was left in an aerial atmosphere of 150° C. for 1000 hours, and the adhesion strength between them on the respective surfaces was again measured to be 1050 g/cm and 750 g/cm. The both values were not almost lowered from the initial ones of the fresh sample. The substrate was left in a high-temperature and high-humidity atmosphere of 85° C. and 85% RH for 1000 hours, and the same measurement was made to give 1000 g/cm and 750 g/cm. These values have no problem for practical use of the substrate.

The results indicate that, when the copper-polyimide substrate as obtained by the method of the present invention, which had a nickel interlayer with a thickness of 0.03 μm and an impurity content of 3% by weight, was heat-treated at a temperature of 420° C. under the condition of a thermal load coefficient of 3.1, then the nickel layer did not remain at all even though it was etched by a conventional method without applying any particular etching means thereto for dissolution of the nickel interlayer. They also indicate that the wiring board to be obtained from the copper-polyimide substrate as formed by the present invention still had a high adhesion strength even after it had been left in a high-temperature atmosphere or in a high-temperature and high-humidity atmosphere for a long period of time. Thus, the copper-polyimide substrate was verified to have high reliability as a printed wiring boards.

EXAMPLE 8

A copper-polyimide substrate was formed and wires were formed thereon in the same manner as in Example 5, except that the substrate was, after the electroless nickel plating, heated up to 480° C. at a temperature-elevating rate of 40° C./min in a nitrogen atmosphere under the condition of a thermal load coefficient of being 0.7, using a far infrared radiation furnace, then the substrate was left under the heat-treating condition for 30 seconds and thereafter cooled at a temperature-lowering rate of 160° C./min. In the thus obtained wiring board, presence or absence of the remaining nickel layer between the formed wires was checked and the insulating resistance value was measured in the same manner as in Example 5.

As a result, no nickel layer remained between the formed wires, and the insulating resistance was $1 \times 10^{10}$ Ω (IPC-TM-650 2.6.3.2. C-24/23/50). Thus, the results were good. The adhesion strength between the copper and the polyimide resin film was measured to be an extremely high value of 1400 g/cm.

The substrate was left in an aerial atmosphere of 150° C. for 1000 hours, and the adhesion strength between them was again measured to be 1150 g/cm. The value was not almost lowered from the initial one of the fresh sample. The substrate was left in a high-temperature and high-humidity atmosphere of 85° C. and 85% RH for 1000 hours, and the same measurement was made to give 1050 g/cm. These values were extremely good.

The results indicate that, when the copper-polyimide substrate as obtained by the method of the present invention, which had a nickel interlayer with a thickness of 0.05 μm and an impurity content of 7% by weight, was heat-treated under the defined condition of having a temperature of 480° C. and a thermal load coefficient of 0.7, using a far infrared radiation furnace in place of a heating furnace, then the nickel layer did not remain at all even though it was etched by a conventional method without applying any particular etching means thereto for dissolution of the nickel interlayer. They also indicate that the wiring board to be obtained from the copper-polyimide substrate as formed by the present invention still had a high adhesion strength even after it had been left in a high-temperature atmosphere or in a high-temperature and high-humidity atmosphere for a long period of time. Thus, the copper-polyimide substrate was verified to have high reliability as a printed wiring boards.

EXAMPLE 9

A 30 cm×30 cm polyimide film of Kapton 200H (produced by Toray-DuPont Co., Ltd.) was dipped in an aqueous solution of 20° C. containing sodium hypochlorite and having a residual chlorine concentration of 5 wt.%/liter, for 5 minutes so that one side of the film surfaces of the polyimide resin film was hydrophilicated. This was then fully washed with water. Using this, a copper-polyimide substrate was prepared and wires were formed thereon in the same manner as in Example 5. In the wiring board thus obtained, presence or absence of the remaining nickel layer between the wires formed was checked and the insulating resistance value was measured. As a result, no nickel layer remained between the formed wires, and the insulating resistance was $1 \times 10^{10}$ Ω (IPC-TM-650 2.6.3.2. C-24/23/50). Thus, the results were good. The adhesion strength between the metal and the polyimide film was measured to be a high value of 1300 g/cm.

The substrate was left in an aerial atmosphere of 150° C. for 1000 hours, and the adhesion strength between them was again measured to be 1100 g/cm. The value was not almost lowered from the initial one of the fresh sample. The substrate was left in a high-temperature and high-humidity atmosphere of 85° C. and 85% RH for 1000 hours, and the same measurement was made to give 1000 g/cm. These values were high and had no problem for practical use.

The results indicate that, when the copper-polyimide substrate as obtained by the method of the present invention of hydrophilicating the surface of the polyimide film by etching with an aqueous sodium hypochlorite solution having a residual chlorine concentration of 5% by weight, which substrate had a nickel interlayer with a thickness of 0.05 μm and an impurity content of 7% by weight, was heat-treated under the defined condition of having a temperature of 400° C. and a thermal load coefficient of 0.7, then the nickel layer did not remain at all even though it was etched by a conventional etching method without applying any particular etching means thereto for dissolution of the nickel interlayer. They also indicate that the wiring board to be obtained from the copper -polyimide substrate as formed by the present invention still had a high adhesion strength even after it had been left in a high-temperature circumstance or in a high-temperature and high-humidity circumstance for a long period of time. Thus, the copper-polyimide substrate was verified to have high reliability as a printed wiring boards.

A 30 cm×30 cm polyimide film of Kapton 200H (produced by Toray-DuPont Co., Ltd.) was dipped in an aqueous solution of 40° C. containing sodium hypochlorite and having a residual chlorine concentration of 4% by weight, for 10 minutes so that the surface of the polyimide film was hydrophilicated. One surface of the film was masked, and the film was subjected to the same catalytic activation treatment as in Example 5. Using this, a copper-polyimide substrate was prepared in the same manner as in Example 6.

The thickness of the electrolessly plated cobalt layer on the substrate thus obtained was 0.03 μm. The phosphorus content as impurity in the layer was 3% by weight.

Afterwards, using a hot air circulating heating furnace (manufactured by Koyo Lindberg Co., Ltd.), the substrate (cobalt-plated polyimide film) was heated up to 420° C. at a temperature-elevating rate of 9° C./min in a nitrogen atmosphere, then the substrate was kept at the temperature for 1.5 hours, and thereafter it was cooled at a temperature-lowering rate of 2.5° C./min. The thermal load coefficient during the heat treatment was 3.1.

Using this, a copper - polyimide substrate was prepared and wires were formed thereon in the same manner as in Example 5. In the wiring board thus obtained, presence or absence of the remaining cobalt layer between the wires formed was checked and the insulating resistance value was measured. As a result, no cobalt layer remained between the formed wires, and the insulating resistance was $1 \times 10^{10}$ Ω ( IPC-TM-650 2.6.3.2. C-24/23/50). Thus, the results were good. The adhesion strength between the metal and the polyimide film was measured to be a high value of 1200 g/cm.

The substrate was left in an aerial atmosphere of 150° C. for 1000 hours, and the adhesion strength between them was again measured to be 1050 g/cm. The value was not almost lowered from the initial one of the fresh sample. The substrate was left in a high-temperature and high-humidity atmosphere of 85° C. and 85% RH for 1000 hours, and the same measurement was made to give 900 g/cm. These values were extremely high. In addition the metal on the polyimide resin film was completely peeled off, and the elongation and the tensile strength of the polyimide film were measured, whereupon no change of the characteristic values of the film was admitted.

The results indicate that, when the copper-polyimide substrate as obtained by the method of the present invention, which substrate had a cobalt interlayer with a thickness of 0.03 μm and an impurity content of 3% by weight, was heat-treated under the defined condition of having a temperature of 420 ° C. and a thermal load coefficient of 3.1, then the cobalt layer did not remain at all even though it was etched by a conventional method without applying any particular etching means thereto for dissolution of the cobalt interlayer. They also indicate that the wiring board to be obtained from the copper-polyimide resin substrate as formed by the present invention still had a high adhesion strength even after it had been left in a high-temperature atmosphere or in a high-temperature and high-humidity atmosphere for a long period of time Thus, the copper-polyimide substrate was verified to have high reliability as a printed wiring boards.

EXAMPLE 11

A copper polyimide substrate was prepared and wires were formed thereon in the same manner as in Example 10, except that the electroless nickel plating under the condition shown in Table 9 was applied to the both surfaces of the polyimide film. In the thus obtained wiring board, presence or absence of the remaining nickel layer between the formed wires was checked and the insulating resistance value was measured. As a result, no nickel layer remained between the formed wires on the both surfaces, and the insulating resistance of the respective surfaces was $1 \times 10^{10}$ Ω and $2 \times 10^{10}$ Ω (IPC-TM-650 2.6.3.2. C-24/23/50). Thus, the results were good.

The adhesion strength between the metal and the polyimide film on the both surfaces was measured to be 1300 g/cm and 950 g/cm. The both values were extremely high. The substrate was left in an aerial atmosphere of 150° C. for 1000 hours, and the adhesion strength between them on the both surfaces was again measured to be 1050 g/cm and 750 g/cm. The values were not almost lowered from the initial ones of the fresh sample. The substrate was left in a high-temperature and high-humidity atmosphere of 85° C. and 85% RH for 1000 hours, and the same measurement was made to give 1000 g/cm and 750 g/cm. These values had no problem for practical use.

The results indicate that, when the copper polyimide substrate as obtained by the method of the present invention, which had a nickel interlayer with a thickness of 0.05 μm and an impurity content of 7% by weight, was heat-treated under the defined condition of having a temperature of 420° C. and a thermal load coefficient of 3.1, then the nickel layer did not remain at all even though it was etched by a conventional method without applying any particular etching means thereto for dissolution of the nickel interlayer. They also indicate that the wiring board to be obtained from the copper polyimide substrate as formed by the present invention still had a high adhesion strength even after it had been left in a high-temperature atmosphere or in a high-temperature and high-humidity atmosphere for a long period of time. Thus, the copper-polyimide substrate was verified to have high reliability as a printed wiring boards.

EXAMPLE 12

A copper-polyimide substrate was formed and wires were formed thereon in the same manner as in Example 5, except that the substrate was, after the electroless nickel plating, heated up to 480° C. at a temperature-elevating rate of 40° C./min in a nitrogen atmosphere under the condition of a thermal load coefficient of being 0.7, using a far infrared radiation furnace, then the substrate was left under the heat-treating condition for 30 seconds and thereafter cooled at a temperature-lowering rate of 160° C./min. In the thus obtained wiring board, presence or absence of the remaining nickel layer between the formed wires was checked and the insulating resistance value was measured. As a result, no nickel layer remained between the formed wires, and the insulating resistance was $1 \times 10^{10}$ Ω (IPC-TM-650 2.6.3.2. C-24/23/50). Thus, the results were good. The adhesion strength between the metal and the polyimide film was measured to be an extremely high value of 1400 g/cm.

The substrate was left in an aerial atmosphere of 150° C. for 1000 hours, and the adhesion strength between them was again measured to be 1150 g/cm. The value was not almost lowered from the initial one of the fresh sample. The substrate was left in a high-temperature and high-humidity atmosphere of 85° C. and 85% RH for 1000 hours, and the same measurement was made to give 1050 g/cm. These values were extremely good.

The results indicate that, when the copper-polyimide substrate as obtained by the method of the present invention, which had an electrolessly plated nickel interlayer with a thickness of 0.05 μm and an impurity content of 7% by weight, was heat-treated, using a far infrared radiation furnace, then the nickel layer did not remain at all even though it was etched by a conventional method without applying any particular etching means thereto for dissolution of the nickel interlayer. They also indicate that the wiring board to be obtained from the copper-polyimide substrate as formed by the present invention still had a high adhesion strength even after it had been left in a high-temperature atmosphere or in a high-temperature and high-humidity atmosphere for a long period of time. Thus, the copper-polyimide substrate was verified to have high reliability as a printed wiring boards.

COMPARATIVE EXAMPLE 6

A 30 cm×30 cm polyimide film of Kapton 200H (produced by Toray-DuPont Co., Ltd.) was dipped in an aqueous solution of 70° C. containing 0.05 mol/liter of potassium permanganate, for 1 hour so that the surface of the polyimide film was hydrophilicated. Next, one surface of the film was masked, and the film was subjected to catalytic activation treatment and electroless nickel plating under the same condition as that in Example 5. As a result, deposition of nickel on the surface of the film was uneven so that the film could not be processed further.

From the result, it is understood that, when the concentration of the potassium permanganate in the hydrophilicating solution is lower than the range defined by the present invention, then hydrophilication of the polyimide resin film could not be effected sufficiently so that formation of the nickel plated layer on the polyimide film is insufficient.

COMPARATIVE EXAMPLE 7

A 30 cm×30 cm polyimide film of Kapton 200H (produced by Toray-DuPont Co., Ltd.) was subjected to hydrophilication and catalytic activation under the same conditions as in Example 5. Then, this was subjected to electroless nickel plating under the condition as shown in Table 14 below.

TABLE 14

| Composition of Plating Bath | |
| --- | --- |
| $NiCl_2.6H_2O$ | 0.1 mol/l |
| $NaH_2PO_2.H_2O$ | 0.1 mol/l |
| Sodium Citrate | 0.1 mol/l |
| pH | 5.6 |
| Plating Condition | |
| Temperature | 60° C. |
| Time | 1 min |

The thickness of the electrolessly plated nickel layer formed was 0.03 μm. The impurity in the layer was substantially phosphorus, and the content thereof was 12% by weight. Using this, a copper-polyimide substrate was prepared and wires were formed thereon in the same manner as in Example 5. In the wiring board obtained, presence or absence of the remaining nickel layer between the wires formed was checked and the insulating resistance value was measured. As a result, presence of the remaining nickel layer was admitted between the wires, and the insulating resistance was noticeably lowered to be $6 \times 10^6 \Omega$ (IPC-TM-650 2.6.3.2 C-24/23/50).

From the results, it is understood that, when the impurity content in the electrolessly plated nickel layer as formed on one surface of a polyimide film is more than 10% by weight, the nickel layer remained in the step of etching the copper-polyimide substrate to lower the insulating resistance value of the substrate, even though the thickness of the electrolessly plated nickel layer was less than 0.1 μm. Thus, the reliability of the substrate for use in manufacturing a wiring board is much low.

COMPARATIVE EXAMPLE 8

A 30 cm×30 cm polyimide film of Kapton 200H (produced by Toray-DuPont Co., Ltd.) was subjected to hydrophilication and catalytic activation under the same conditions as in Example 5. Then, this was subjected to electroless nickel plating under the condition as shown in Table 15 below.

TABLE 15

| Composition of Plating Bath | |
| --- | --- |
| $NiCl_2.6H_2O$ | 0.1 mol/l |
| $NaH_2PO_2.H_2O$ | 0.1 mol/l |
| Sodium Pyrophosphate | 0.2 mol/l |
| pH | 10 |
| Plating Condition | |
| Temperature | 60° C. |
| Time | 5 min |

The thickness of the electrolessly plated nickel layer formed was 0.15 μm. The phosphorus content as impurity in the layer was 3.4% by weight. Using this, a copper-polyimide substrate was prepared and wires were formed thereon in the same manner as in Example 5. In the wiring board obtained, presence or absence of the remaining nickel layer between the wires formed was checked and the insulating resistance value was measured. As a result, presence of the remaining nickel layer was admitted between the wires, and the insulating resistance was noticeably lowered to be $3 \times 10^6 \Omega$ (IPC-TM-650 2.6.3.2 C-4/23/50).

From the results, it is understood that, when the thickness of the electrolessly plated nickel layer as formed on the polyimide film was more than 0.1 μm, then the nickel layer remained in the step of etching the copper-polyimide substrate to lower the insulating resistance value of the substrate, even though the impurity content in the nickel layer was lower than 10% by weight to be 3.4% by weight. Thus, the reliability of the substrate for use in manufacturing a wiring board is much low.

COMPARATIVE EXAMPLE 9

A 30 cm×30 cm polyimide film of Kapton 200H (produced by Toray-DuPont Co., Ltd.) was subjected to hydrophilication and catalytic activation under the same conditions as in Example 5. Then, this was subjected to electroless nickel plating under the condition as shown in Table 16 below.

TABLE 16

| Composition of Plating Bath | |
| --- | --- |
| $NiCl_2.6H_2O$ | 0.1 mol/l |
| $NaH_2PO_2.H_2O$ | 0.1 mol/l |
| Sodium Pyrophosphate | 0.2 mol/l |
| pH | 10 |
| Plating Condition | |
| Temperature | 60° C. |
| Time | 10 sec |

The thickness of the electrolessly plated nickel layer formed was 0.005 μm. The impurity phosphorus content in the layer was 3.4% by weight. Using this, a copper-polyimide substrate was prepared and wires were formed thereon in the same manner as in Example 5. In the wiring board obtained, presence or absence of the remaining nickel layer between the wires formed was checked and the insulating resistance value was measured. As a result, presence of the remaining nickel layer was not admitted between the wires, and the insulating resistance was satisfactorily $4 \times 10^{10}$ Ω (IPC-TM-650 2.6.3.2 C-24/23/50). The adhesion strength between the metal and the polyimide film of the substrate was measured to be satisfactorily 1250 g/cm. However, when the substrate was left in an aerial atmosphere of 150° C. for 1000 hours, the adhesion strength noticeably lowered from 1250 g/cm to 100 g/cm. When it was left in a high-temperature and high-humidity atmosphere of 85° C. and 85% RH for 1000 hours, the adhesion strength also lowered to 150 g/cm.

From the results, it is understood that, when the thickness of the electrolessly plated nickel layer as formed on the polyimide film was less than 0.01 μm, then the adhesion strength between the metal and the polyimide film noticeably lowered when the substrate was left in a high-temperature atmosphere or in a high-temperature and high-humidity atmosphere for a long period of time, even though the impurity content in the nickel layer was lower than 10% by weight. Thus, the reliability of the substrate for use in manufacturing a wiring board is much low.

COMPARATIVE EXAMPLE 10

A copper-polyimide substrate was formed in the same manner as in Example 5, except that the thermal load coefficient in the heat treatment was 0.2 and that the reaching highest temperature in the same was 380° C. The adhesion strength between the metal and the polyimide film in the substrate was measured to be 900 g/cm. However, when the substrate was left in a high-temperature and high-humidity atmosphere of 85° C. and 85% RH for 1000 hours, the adhesion strength was measured to noticeably lower to 50 g/cm.

The results indicate that, when the thermal load coefficient in the heat treatment was lower than the defined value to be 0.2, then the adhesion strength between the metal and the polyimide film in the substrate noticeably lowered after long-time exposure of the substrate to a high-temperature and high-humidity atmosphere. Thus, the reliability of the substrate for use in manufacturing a wiring board is much low.

COMPARATIVE EXAMPLE 11

A 30 cm×30 cm polyimide film of Kapton 200H (produced by Toray-DuPont Co., Ltd.) was dipped in an aqueous solution of 30° C. containing sodium hypochlorite having a residual chlorine concentration of 1 wt.%/liter, for 15 minutes so that the surface of the polyimide film was hydrophilicated. Next, one side of the film surfaces was masked, and the film was subjected to catalytic activation treatment and electroless nickel plating under the same condition as in Example 9. As a result, deposition of nickel on the surface of the film was uneven so that the film could not be processed further.

From the result, it is understood that, when the concentration of the residual chlorine concentration of sodium hypochlorite in the hydrophilicating solution is lower than the range defined by the present invention to be 1 wt.%/liter, then etching with the solution is poor so that formation of the electrolessly plated nickel layer on the polyimide film is insufficient.

COMPARATIVE EXAMPLE 12

A 30 cm×30 cm polyimide film of Kapton 200H (produced by Toray-DuPont Co., Ltd.) wa dipped in an aqueous solution of 20° C. containing sodium hypochlorite and having an residual chlorine concentration of 5 wt.%/liter, for 5 minutes so that one side of the film surfaces of the polyimide film was hydrophilicated. This was then fully washed with water. Using this polyimide substrate was electroless plated in the same manner as shown in Table 14. The thickness of the electrolessly plated nickel layer formed was 0.03 μm. The phosphorus content as impurity in the layer was 12% by weight. Using this, a copper-polyimide substrate was prepared and wires were formed thereon in the same manner as in Example 5. In the wiring board obtained, presence or absence of the remaining nickel layer between the wires formed was checked and the insulating resistance value was measured. As a result, presence of the remaining nickel layer was admitted between the wires, and the insulating resistance was noticeably lowered to be $6 \times 10^6$ (IPC-TM-650 2.6.3.2 C-24/23/50).

From the results, it is understood that, when the impurity content in the electrolessly plated nickel layer as formed on the surface of a polyimide film is more than 10% by weight, the nickel layer remained in the step of etching the copper-polyimide substrate to lower the insulating resistance value of the substrate, even though the thickness of the electrolessly plated nickel layer as formed on the polyimide film was less than 0.1 μm. Thus, the reliability of the substrate for use in manufacturing a wiring boards is much low.

COMPARATIVE EXAMPLE 13

A 30 cm×30 cm polyimide film of Kapton 200H (produced by Toray-DuPont Co., Ltd.) was subjected to hydrophilication and catalytic activation under the same conditions as in Example 9. Using this, a copper-polyimide substrate was prepared in the same manner as in Comparative Example 8. The thickness of the electrolessly plated nickel layer formed was 0.15 m. The phosphorus content as impurity in the layer was 3.4% by weight. Using this, a copper-polyimide substrate was prepared and wires were formed thereon in the same manner as in Example 5. In the wiring board obtained, presence or absence of the remaining nickel layer between the wires formed was checked and the insulating resistance value was measured. As a result, presence of the remaining nickel layer was admitted between the wires, and the insulating resistance was noticeably lowered to be $3 \times 10^6$ Ω (IPC-TM-650 2.6.3.2 C-24/23/50).

From the results, it is understood that, when the thickness of the electrolessly plated nickel layer as formed on the polyimide film was more than 0.10 μm, then the nickel layer remained in the step of etching the copper - polyimide substrate to lower the insulating resistance value of the substrate, even though the impurity content in the nickel layer was lower than 10% by weight to be 3.4% by weight. Thus, the reliability of the substrate for use in manufacturing a wiring board is much low.

COMPARATIVE EXAMPLE 14

A 30 cm×30 cm polyimide film of Kapton 200H (produced by Toray-DuPont Co., Ltd.) was subjected to hydrophilication and catalytic activation under the same conditions as in Example 5. Using this, a copper-polyimide substrate was prepared in the same manner as in Comparative Example 9. The thickness of the electrolessly plated nickel layer formed was 0.005 μm. The phosphorus content impurity in the layer was 3.4% by weight.

Using this, a copper - polyimide substrate was prepared and wires were formed thereon in the same manner as in Example 5. In the wiring board obtained, presence or absence of the remaining nickel layer between the wires formed was checked and the insulating resistance value was measured. As a result, presence of the remaining nickel layer was not admitted between the wires, and the insulating resistance was satisfactorily $4 \times 10^{10}$ Ω (IPC-TM-650 2.6.3.2 C-24/23/50).

The adhesion strength between the metal and the polyimide film of the substrate was measured to be satisfactorily 1250 g/cm. However, when the substrate was left in an aerial atmosphere of 150° C. for 1000 hours, the adhesion strength noticeably lowered from 1250 g/cm to 100 g/cm. When it was left in a high-temperature and high-humidity atmosphere of 85° C. and 85% RH for 1000 hours, the adhesion strength also lowered to 150 g/cm.

From the results, it is understood that, when the thickness of the electrolessly plated nickel layer as formed on the polyimide film was less than 0.01 μm, then the adhesion strength between the metal and the polyimide film noticeably lowered when the substrate was left in a high-temperature atmosphere or in a high-temperature and high-humidity atmosphere for a long period of time, even though the impurity content in the nickel layer was lower than 10% by weight. Thus, the reliability of the substrate for use in manufacturing a wiring boards is much low.

COMPARATIVE EXAMPLE 15

A copper-polyimide substrate was formed in the same manner as in Example 9, except that the thermal load coefficient in the heat treatment was 0.2 and that the reaching highest temperature in the same was 380° C. The adhesion strength between the metal and the polyimide film in the substrate was measured to be 900 g/cm. However, when the substrate was left in a high-temperature and high-humidity atmosphere of 85° C. and 85% RH for 1000 hours, the adhesion strength was measured to noticeably lower to 50 g/cm.

The results indicate that, when the thermal load coefficient in the heat treatment was lower than the defined value to be 0.2, then the adhesion strength between the metal and the polyimide film in the substrate noticeably lowered after long-time exposure of the substrate to a high-temperature and high-humidity atmosphere. Thus, the reliability of the substrate for use in manufacturing a wiring boards is much low.

In accordance with the present invention as mentioned above in detail, a metal, interlayer of nickel, cobalt, nickel alloys or cobalt alloys may well be formed on a polyimide film by electroless plating, without lowering the adhesion strength between the metal and the polyimide film. The adhesion strength between them may well be maintained even under a high-temperature atmosphere or under a high-temperature and high-humidity atmosphere Where the copper-polyimide substrate as obtained by the present invention is formed into a wiring board such as FPC or TAB tapes, payment of any special attention to the copper etching step for wiring is unnecessary for complete removal of nickel, cobalt, nickel alloys or cobalt alloys. Therefore, the present invention much contributes to improvement of the quality of FPC and TAB tapes in a high-temperature atmosphere or a high-temperature and high humidity atmosphere.

What is claimed is:

1. A method of manufacturing a copper-polyimide substrate, which comprises hydrophilicating the surface(s) of a polyimide film; applying a catalyst for electroless plateing thereto; subjecting the film to electroless plateing with a metal other than copper; subjecting the plated film to electroless copper plating or to electroless copper plating followed by electrolytic copper plating, the electroless plateing being effected with any of nickel, cobalt, nickel alloy or cobalt alloy in such a way that the electrolessly plated layer has a thickness of from 0.01 to 0.1 μm and that the impurity content in the layer is 10% by weight or less; and heat treating the substrate thus formed in an inert atmosphere under the condition that the highest temperature that the substrate reaches falls within the range of from 350° to 540° C. and that the thermal load coefficient (D) to be obtained by the following numerical expression (1) falls within the range of from 0.3 to 3.5;

$$D = \int_{t = to}^{t = ti} (0.2/\{1.5\exp(447.7 - Ti)/19.196\}) dt \quad (1)$$

where ti indicates a desired time; and Ti indicates the temperature of the substrate itself at that time.

2. The method of manufacturing a copper-polyimide substrate as claimed in claim 1, wherein said steps are applied to one surface of the polyimide film.

3. The method of manufacturing a copper-polyimide substrate as claimed in claim 1, wherein said steps are applied to both surfaces of the polyimide film.

4. The method of manufacturing a copper-polyimide substrate as claimed in claim 1, wherein the hydrophilication of the surface(s) of the polyimide film is effected with a mixed aqueous solution comprising a hydrazine hydrate and an alkali metal hydroxide.

5. The method of manufacturing a copper-polyimide substrate as claimed in claim 1, wherein the hydrophilication of the surface(s) of the polyimide film is effected with a mixed aqueous solution containing from 1 to 15 mol/liter of a hydrazine hydrate and from 0.5 to 5 mol/liter of an alkali metal hydroxide.

6. The method of manufacturing a copper-polyimide substrate as claimed in claim 4, in which the alkali metal hydroxide is selected from the group consisting of sodium hydroxide and potassium hydroxide, 7. The method of manufacturing a copper-polyimide substrate as claimed in claim 1, wherein the hydrophilication of the surface(s) of the polyimide film is effected with an aqueous solution containing a permanganate or a hypochlorite.

8. The method of manufacturing a copper-polyimide substrate as claimed in claim 7, wherein the permanganate is sodium permanganate or potassium permanganate and the concentration of the salt in the solution is 0.1 mol/liter or more.

9. The method of manufacturing a copper polyimide substrate as claimed in claim 7, wherein the hypochlorite is sodium hypochlorite or potassium hypochlorite and the residual chlorine concentration of the salt in the aqueous solution is from 3 to 13% by weight/liter.

10. The method of manufacturing a copper-polyimide substrate as claimed in claim 5, in which the alkali metal hydroxide is sodium hydroxide or potassium hydroxide.

* * * * *